US011049815B2

(12) United States Patent
Choi et al.

(10) Patent No.: US 11,049,815 B2
(45) Date of Patent: Jun. 29, 2021

(54) SEMICONDUCTOR PACKAGE

(71) Applicant: SAMSUNG ELECTRONICS CO., LTD., Suwon-si (KR)

(72) Inventors: Jooyoung Choi, Suwon-si (KR); Taewook Kim, Suwon-si (KR); Byungho Kim, Suwon-si (KR); Sangseok Hong, Suwon-si (KR); Jaehoon Choi, Suwon-si (KR); Seongjin Shin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/584,027

(22) Filed: Sep. 26, 2019

(65) Prior Publication Data

US 2020/0144192 A1 May 7, 2020

(30) Foreign Application Priority Data

Nov. 6, 2018 (KR) ........................ 10-2018-0135128

(51) Int. Cl.

| | |
|---|---|
| ***H01L 23/538*** | (2006.01) |
| ***H01L 23/00*** | (2006.01) |
| ***H01L 23/31*** | (2006.01) |
| ***H01L 23/367*** | (2006.01) |

(52) U.S. Cl.

CPC ...... *H01L 23/5389* (2013.01); *H01L 23/3128* (2013.01); *H01L 23/367* (2013.01); *H01L 23/5383* (2013.01); *H01L 23/5386* (2013.01); *H01L 24/20* (2013.01); *H01L 2224/214* (2013.01)

(58) Field of Classification Search

CPC ... H01L 23/28–3192; H01L 21/56–568; H01L 2924/181–186; H01L 23/36–3738; H01L 23/367–3677; H01L 23/373–3738; H01L 23/44–445; H01L 23/473–4735; H01L 23/467; H01L 21/4871–4882; H01L 23/40–4093

See application file for complete search history.

(56) References Cited

U.S. PATENT DOCUMENTS

2012/0104591 A1 5/2012 Warren et al.
2018/0342449 A1* 11/2018 Kim .................... H01L 23/5389
2019/0096791 A1* 3/2019 Jeng ........................ H01L 24/03

FOREIGN PATENT DOCUMENTS

JP 2012-015192 A 1/2012

* cited by examiner

*Primary Examiner* — Selim U Ahmed
*Assistant Examiner* — Evan G Clinton
(74) *Attorney, Agent, or Firm* — Sughrue Mion, PLLC

(57) ABSTRACT

A semiconductor package includes a connection structure having first and second surfaces opposing each other and including a redistribution layer. A semiconductor chip is disposed on the first surface of the connection structure and has connection pads connected to the redistribution layer. An encapsulant is disposed on the first surface of the connection structure and covers the semiconductor chip. A support pattern is disposed on a portion of an upper surface of the encapsulant. A heat dissipation bonding material has a portion embedded in the encapsulant in a region overlapping the semiconductor chip and extends to the upper surface of the encapsulant so as to cover the support pattern. A heat dissipation element is bonded to the upper surface of the encapsulant by the heat dissipation bonding material.

20 Claims, 13 Drawing Sheets

100D
120
121 122 123 182
132S CP 182b 182a 185
110H H 150B
132P
132
130
133
112d 113c 111c 112b 111a 113a 112a 111b 113b 112c 110
140A
150A
140B
141 142 143 170 160 150A
140

SEMICONDUCTOR PACKAGE

CROSS-REFERENCE TO RELATED APPLICATION(S)

This application claims benefit of priority to Korean Patent Application No. 10-2018-0135128 filed on Nov. 6, 2018 in the Korean Intellectual Property Office, the disclosure of which is incorporated herein by reference in its entirety.

BACKGROUND

1. Field

The present disclosure relates to a semiconductor package.

2. Description of Related Art

A significant recent trend in the development of technology related to semiconductor chips has been reductions in the size of semiconductor chips. Therefore, in the field of package technology, in accordance with a rapid increase in demand for small-sized semiconductor chips, or the like, demand for semiconductor packages having a compact size while including a plurality of pins has increased.

One type of package technology suggested to satisfy the technical demand as described above may be a fan-out semiconductor package. Such a fan-out semiconductor package has a compact size and may allow a plurality of pins to be implemented by redistributing connection terminals up to a region that is out of a region overlapping a semiconductor chip. Meanwhile, a semiconductor package has been recently required to improve heat dissipation characteristics.

SUMMARY

An aspect of the present disclosure may provide a semiconductor package in which heat dissipation characteristics are improved.

According to an aspect of the present disclosure, a semiconductor package may include a connection structure having first and second surfaces opposing each other and including a redistribution layer. A semiconductor chip is disposed on the first surface of the connection structure and has connection pads connected to the redistribution layer. An encapsulant is disposed on the first surface of the connection structure and covers the semiconductor chip, and a support pattern is disposed on a partial region of an upper surface of the encapsulant. A heat dissipation bonding material has a portion embedded in the encapsulant in a region overlapping the semiconductor chip and extends to the upper surface of the encapsulant so as to cover the support pattern. A heat dissipation element is bonded to the upper surface of the encapsulant by the heat dissipation bonding material.

According to another aspect of the present disclosure, a semiconductor package may include a semiconductor chip having an active surface having connection pads disposed thereon and an inactive surface opposing the active surface. A connection structure is disposed on the active surface of the semiconductor chip and includes a redistribution layer electrically connected to the connection pads, and an encapsulant covers the inactive surface of the semiconductor chip and has a concave portion formed in a region overlapping the semiconductor chip. A support pattern is disposed on at least a region of an upper surface of the encapsulant positioned in the vicinity of the concave portion, and a heat dissipation bonding material is disposed in the concave portion and extends to the upper surface of the encapsulant so as to cover the support patter. A heat dissipation element is disposed on the upper surface of the encapsulant so as to cover the heat dissipation bonding material and is bonded to the encapsulant by the heat dissipation bonding material.

According to a further aspect of the present disclosure, a semiconductor package includes a semiconductor chip having an active surface with connection pads thereon and a second surface opposite to the active surface. An encapsulant contacts the semiconductor chip and has an opening overlapping with the semiconductor chip in a surface of the encapsulant facing away from the second surface of the semiconductor chip. A support pattern is disposed adjacent to the opening on the surface of the encapsulant facing away from the semiconductor chip, and a bonding material is disposed in the opening of the encapsulant and covers at least a portion of the support pattern adjacent to the opening. A heat dissipation element is disposed on the bonding material to overlap the opening.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a downward direction in relation to cross sections of the drawings for convenience, while an upper side, an upper portion, an upper surface, and the like, are used to refer to an opposite direction to the downward direction. However, these directions are defined for convenience of explanation, and the claims are not particularly limited by the directions defined as described above, and concepts of upper and lower portions may be exchanged with each other.

The meaning of a “connection” of a component to another component in the description conceptually includes an indirect connection through an adhesive layer as well as a direct connection between two components. In addition, “electrically connected” conceptually includes a physical connection and a physical disconnection. It can be understood that when an element is referred to with terms such as “first” and “second”, the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term “an exemplary embodiment” used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
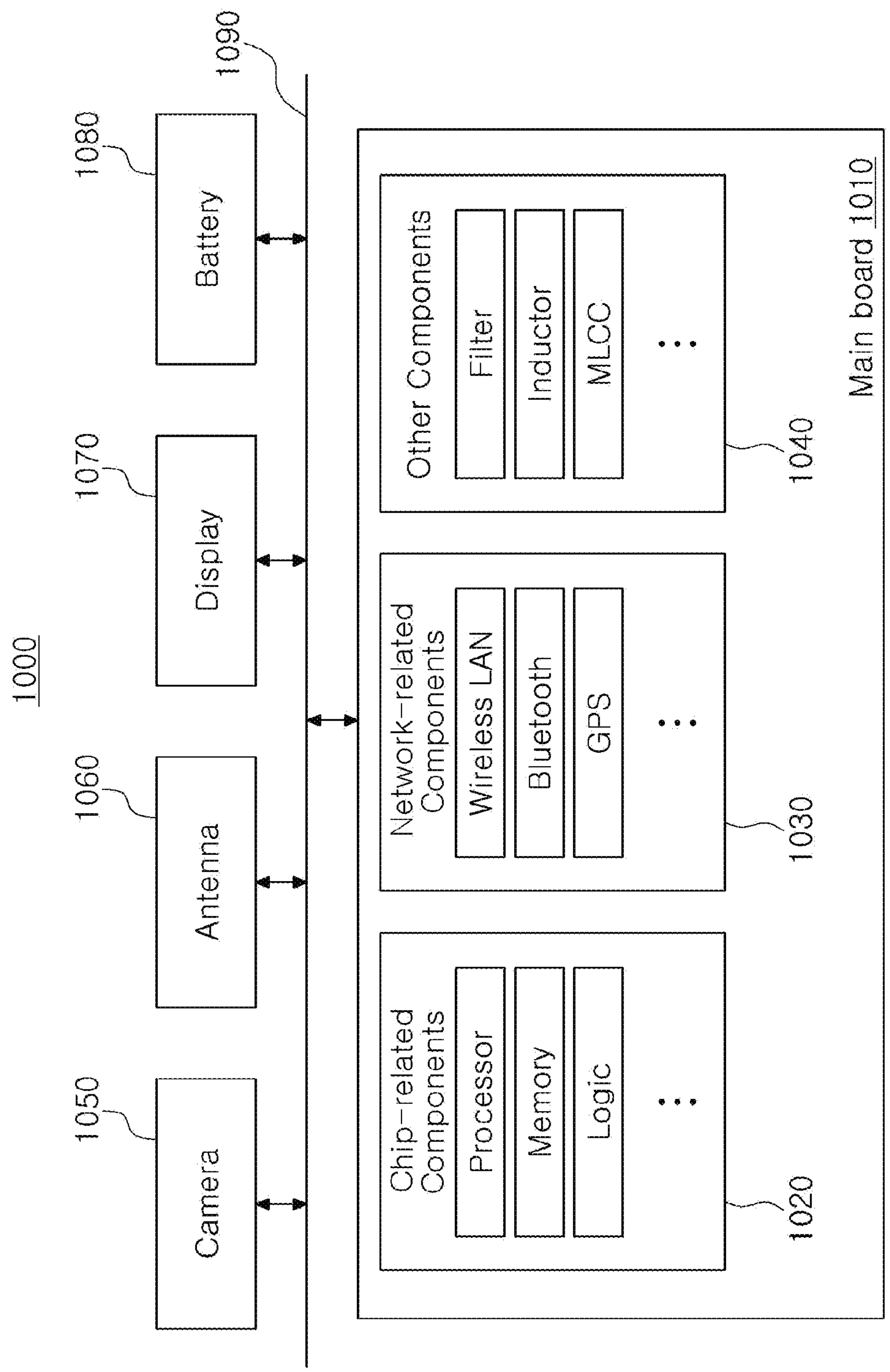
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
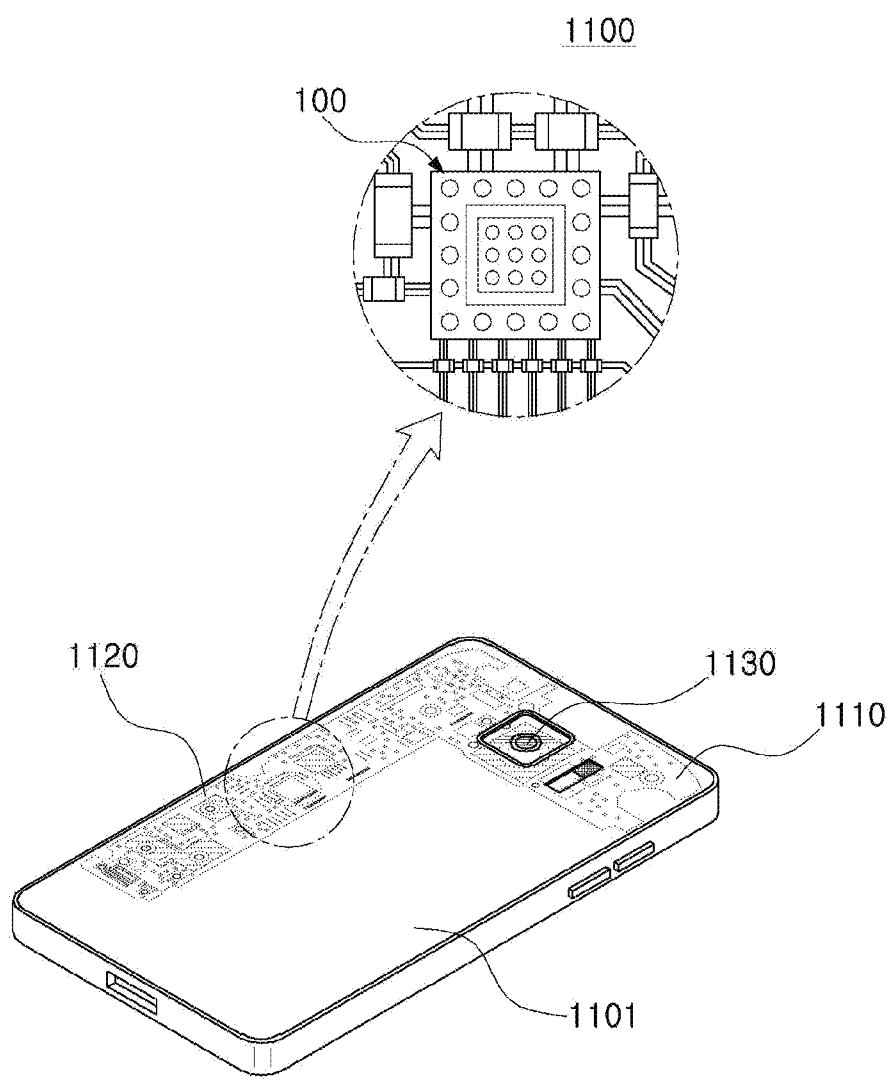
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the mainboard 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a semiconductor finished product in oneself, and may be damaged due to external physical or chemical impact. Therefore, the semiconductor chip is not used in oneself, and is packaged and is used in an electronic device, or the like, in a package state.

The reason why semiconductor packaging is used is that there is a difference in a circuit width between the semiconductor chip and a mainboard of the electronic device in terms of electrical connection. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor and the mainboard is used.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the accompanying drawings.

Fan-In Semiconductor Package

Figure 3B:
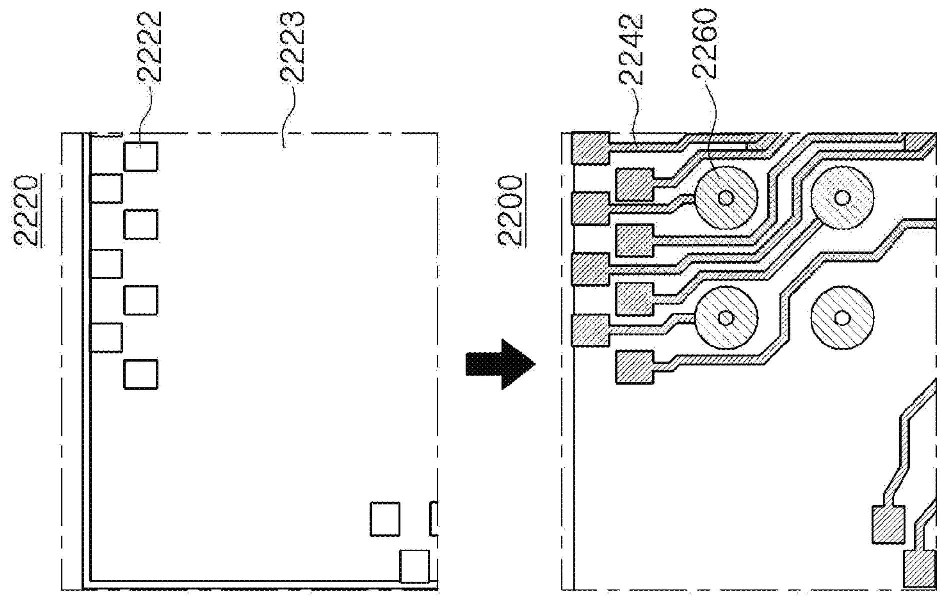
FIGS. 3A and 3B are schematic cross-sectional views illustrating a fan-in semiconductor package before and after being packaged.
Figure 3A:
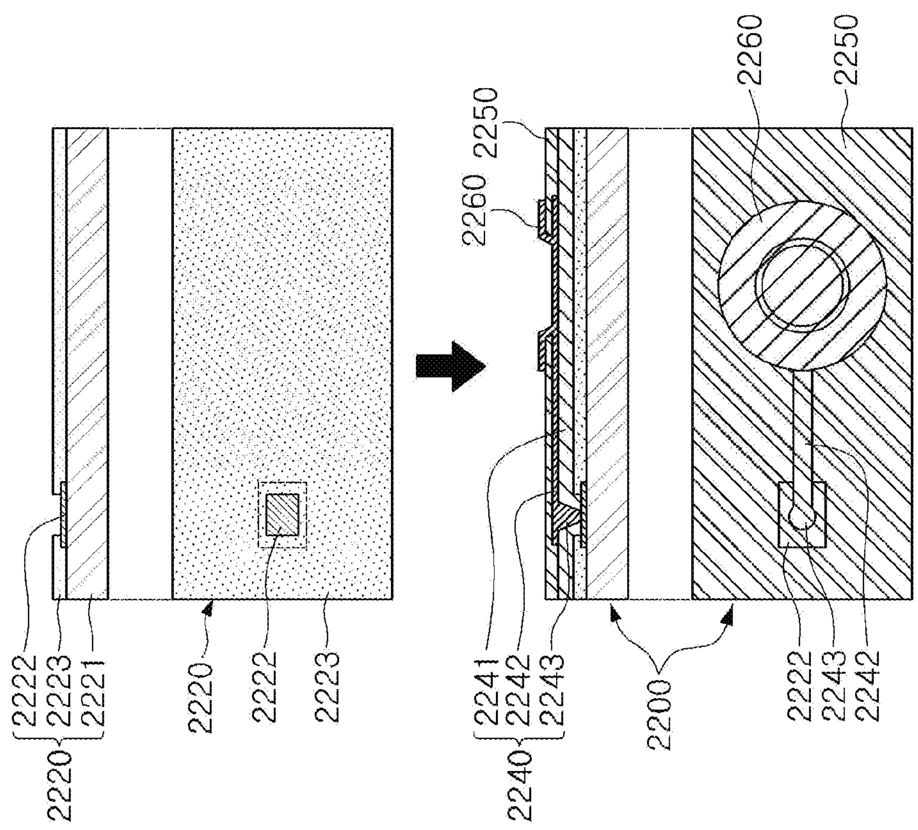
Figure 4:
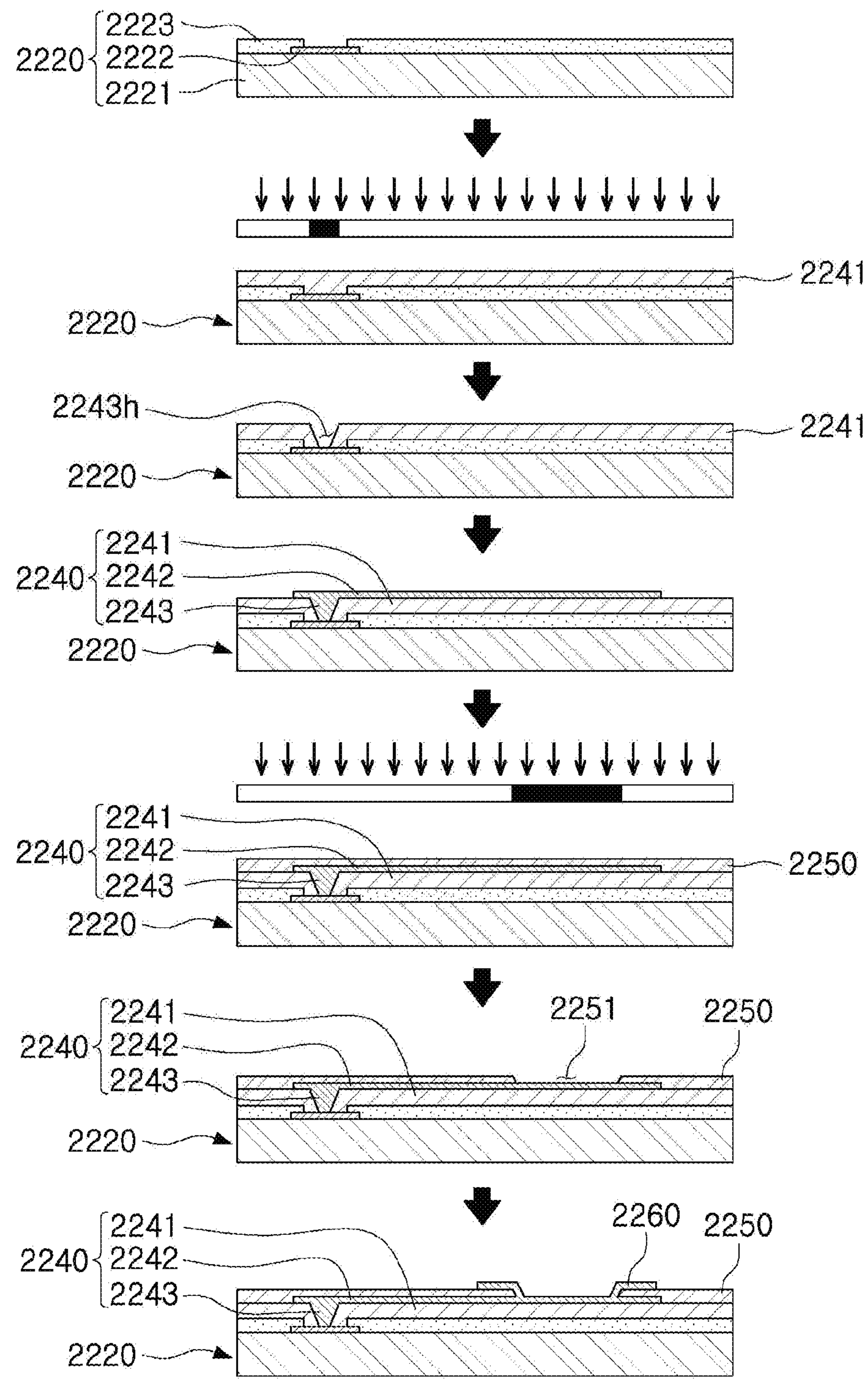
FIG. 4 is schematic cross-sectional views illustrating a packaging process of a fan-in semiconductor package.

FIGS. 3A and 3B are schematic cross-sectional views illustrating states of a fan-in semiconductor package before and after being packaged, and FIG. 4 is schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. Since the connection pads 2222 may be significantly small, it may be difficult to mount the integrated circuit (IC) on an intermediate level printed circuit board (PCB) as well as on the mainboard of the electronic device, or the like.

Therefore, a connection structure 2240 may be formed depending on a size of the semiconductor chip 2220 on the semiconductor chip 2220 in order to redistribute the connection pads 2222. The connection structure 2240 may be formed by forming an insulating layer 2241 on the semiconductor chip 2220 using an insulating material such as a photoimageable dielectric (PID) resin, forming via holes 2243*h* opening the connection pads 2222, and then forming wiring patterns 2242 and vias 2243. Then, a passivation layer 2250 protecting the connection structure 2240 may be formed, an opening 2251 may be formed, and an underbump metal layer 2260, or the like, may be formed. That is, a fan-in semiconductor package 2200 including, for example, the semiconductor chip 2220, the connection structure 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost.

Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a small size. In addition, due to the disadvantage described above, the fan-in semiconductor package may not be directly mounted and used on the mainboard of the electronic device. The reason is that even in the case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
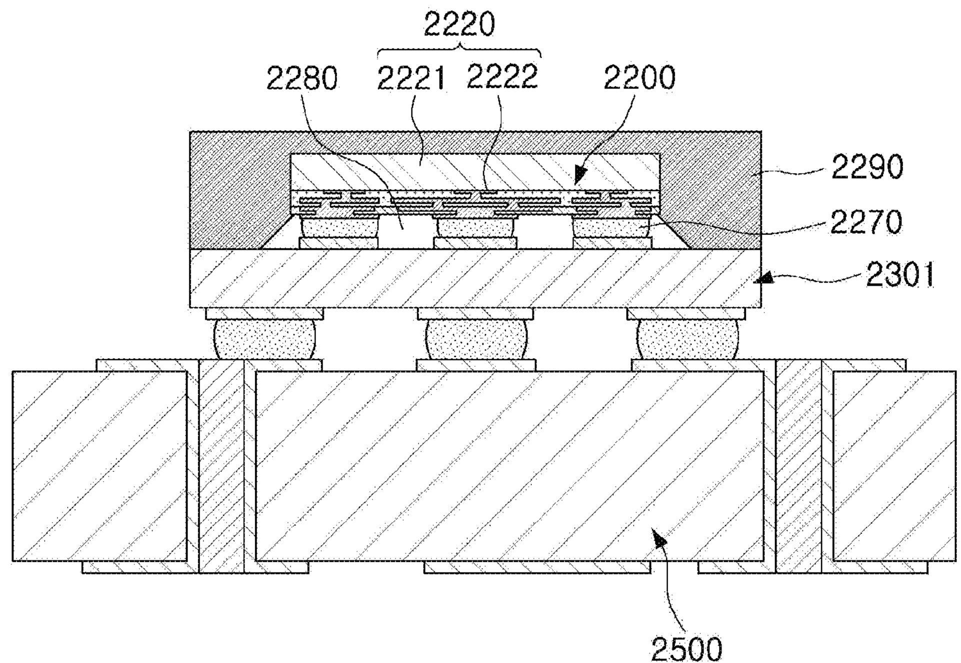
FIG. 5 is a schematic cross-sectional view illustrating a fan-in semiconductor package mounted on an interposer substrate and ultimately mounted on a mainboard of an electronic device.
Figure 6:
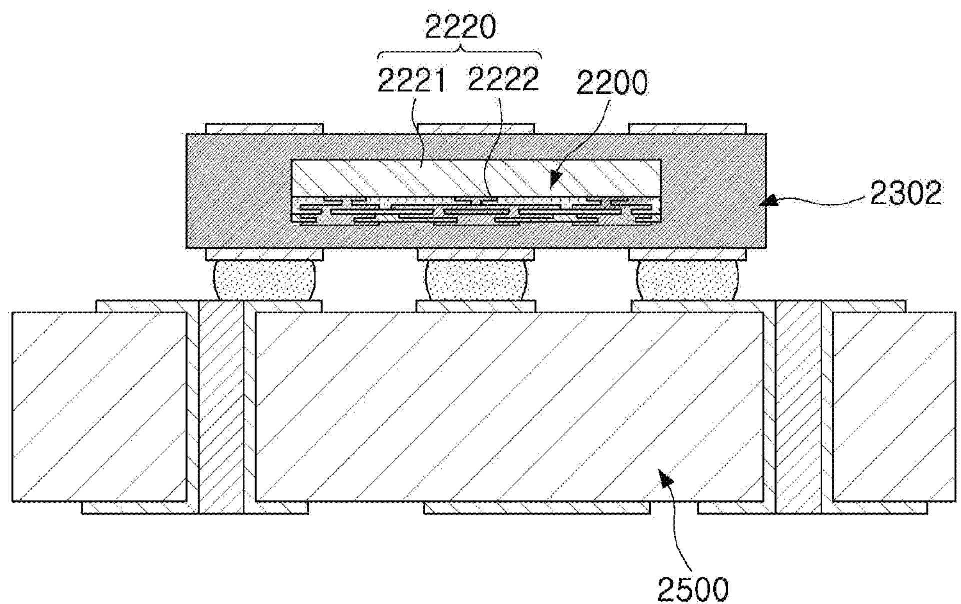
FIG. 6 is a schematic cross-sectional view illustrating a fan-in semiconductor package embedded in an interposer substrate and ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device, and FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a mainboard 2500 of an electronic device in a state in which it is mounted on the interposer substrate 2301. In this case, low melting point metal or alloy balls 2270, and the like, may be fixed by an underfill resin 2280, or the like, and an outer side of the semiconductor chip 2220 may be covered with an encapsulant 2290, or the like. Alternatively, a fan-in semiconductor package 2200 may be embedded in a separate interposer substrate 2302, connection pads 2222, that is, I/O terminals, of a semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
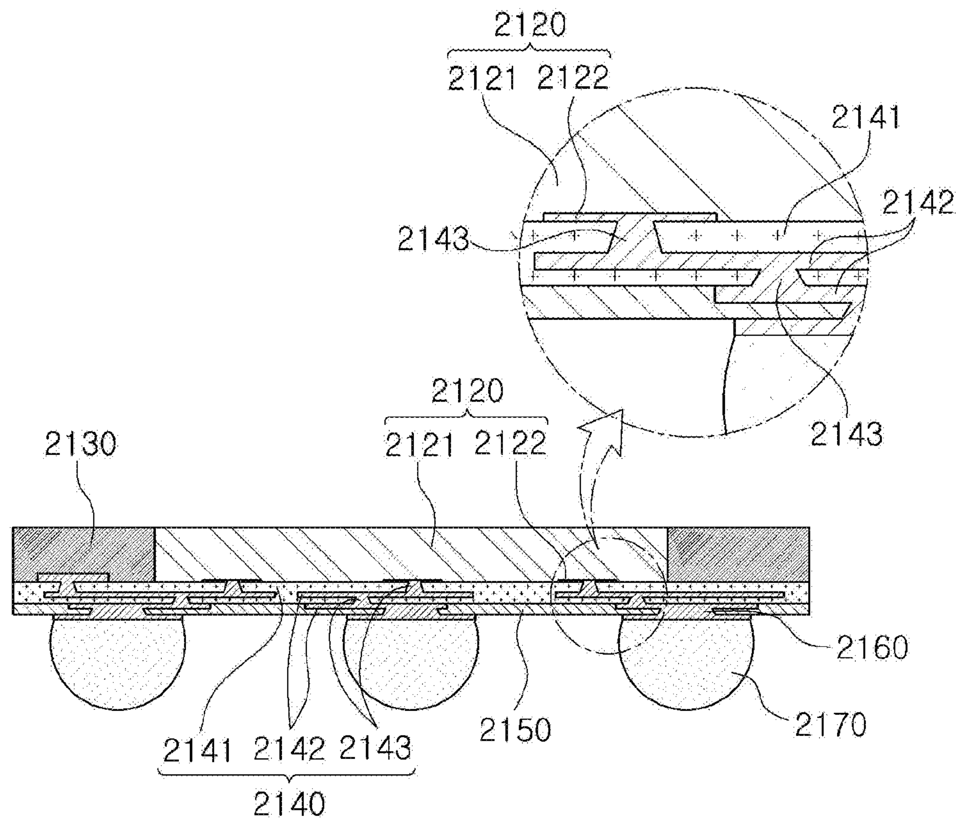
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection structure 2140. In this case, a passivation layer 2150 may further be formed on the connection structure 2140, and an underbump metal layer 2160 may further be formed in openings of the passivation layer 2150. Low melting point metal or alloy balls 2170 may be further formed on the underbump metal layer 2160. The semiconductor chip 2120 may be an integrated circuit (IC) including a body 2121, the connection pads 2122, a passivation layer (not illustrated), and the like. The connection structure 2140 may include an insulating layer 2141, redistribution layers 2142 formed on the insulating layer 2141, and vias 2143 electrically connecting the connection pads 2122 and the redistribution layers 2142 to each other.

In the present manufacturing process, the connection structure 2140 may be formed after the encapsulant 2130 is formed outside the semiconductor chip 2120. In this case, the connection structure 2140 may be formed after the semiconductor chip 2120 is encapsulated, and the vias 2143 connected to the redistribution layers may thus have a width that becomes small as they become close to the semiconductor chip (see an enlarged region).

As described above, the fan-out semiconductor package may have a form in which I/O terminals of the semiconductor chip are redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection structure formed on the semiconductor chip as described above. Therefore, even in the case in which a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
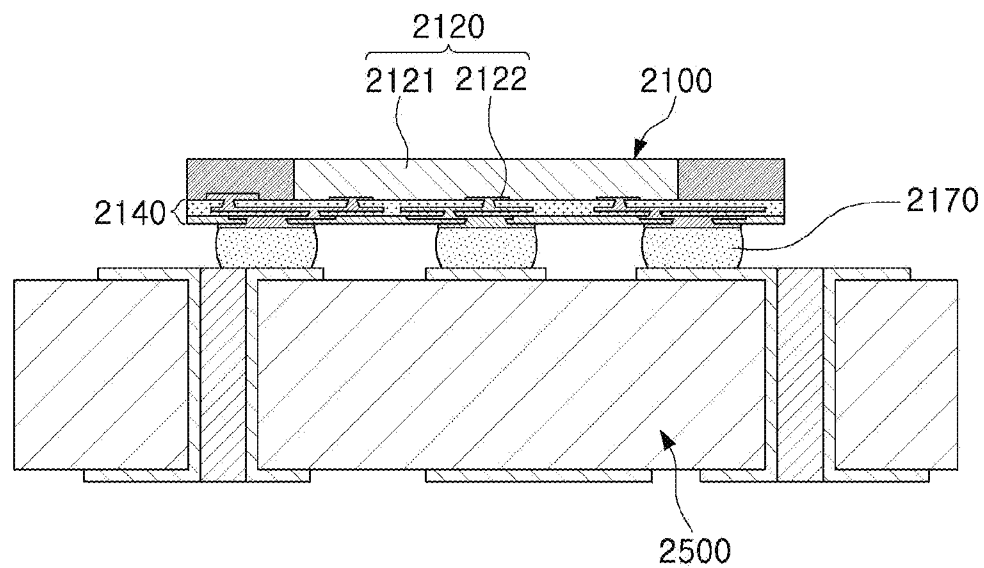
FIG. 8 is a schematic cross-sectional view illustrating a fan-out semiconductor package mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through low melting point metal or alloy balls 2170, or the like. That is, as described above, the fan-out semiconductor package 2100 includes the connection structure 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Figure 9:
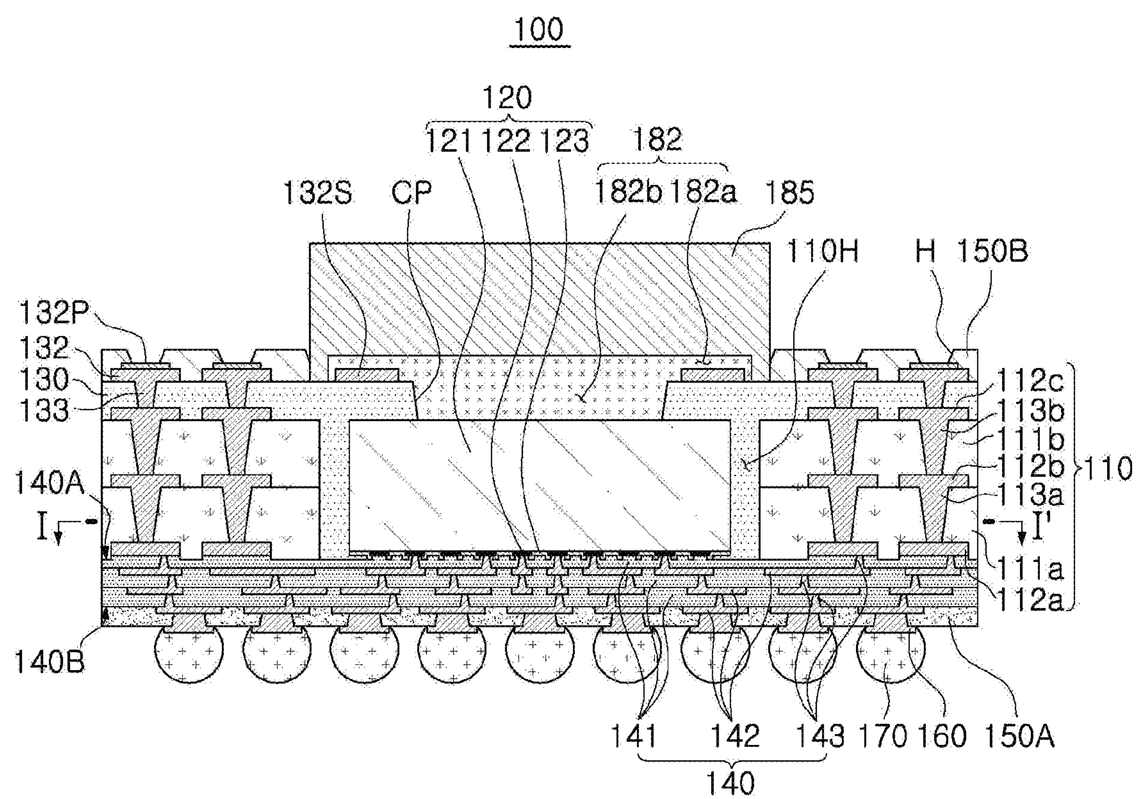
FIG. 9 is a schematic cross-sectional view illustrating a semiconductor package according to an exemplary embodiment in the present disclosure.
Figure 10:
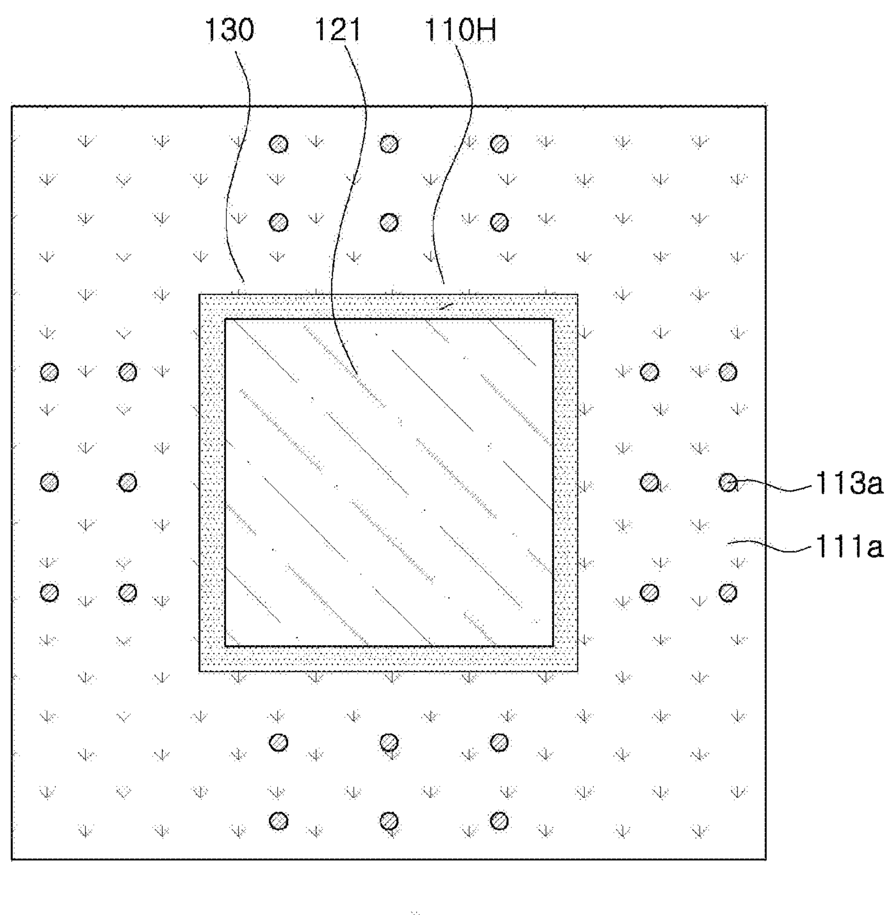
FIG. 10 is a plan view taken along line I-I' of the semiconductor package of FIG. 9.

FIG. 9 is a schematic cross-sectional view illustrating a semiconductor package according to an exemplary embodiment in the present disclosure, and FIG. 10 is a plan view taken along line I-I' of the semiconductor package of FIG. 9.

Referring to FIGS. 9 and 10, a semiconductor package 100 according to the present exemplary embodiment may include a connection structure 140 having a first surface 140A and a second surface 140B opposing each other, a semiconductor chip 120 disposed on the first surface 140A of the connection structure 140, and an encapsulant 130 disposed on the first surface 140A of the connection structure 140 and encapsulating the semiconductor chip 120.

The semiconductor package 100 may further include a frame 110, a wiring pattern 132, wiring vias 133, first and second passivation layers 150A and 150B, underbump metals 160, electrical connection metals 170, a heat dissipation bonding material 182, and a heat dissipation element 185.

The connection structure 140 may include three-layered redistribution layers 142 implemented on a plurality of (for example, three) insulating layers 141, and connection pads 122 of the semiconductor chip 120 disposed on the first surface 140A of the connection structure 140 may be connected to the redistribution layers 142.

The frame 110 may be disposed on the first surface 140A of the connection structure 140, and may include a cavity 110H in which the semiconductor chip 120 is accommodated. The frame 110 may include a wiring structure connecting an upper surface and a lower surface of the frame 110 with each other. The wiring structure used in the present exemplary embodiment may include three-layered wiring layers **112*a*, 112*b*, and 112*c* and first and second wiring vias 113*a* and 113*b* connecting the three-layered wiring layers 112*a*, 112*b*, and 112*c* to each other, but is not limited thereto. In some exemplary embodiments, the wiring structure may be formed to have layers of which the number is different from that in the present exemplary embodiment and a structure different from that described in the present exemplary embodiment (see, e.g., FIG. 16). The wiring structure (particularly, a first wiring layer 112*a*) of the frame 110 may be connected to (e.g., in contact with) the redistribution layer 142 of the connection structure 140**.

In the present exemplary embodiment, the encapsulant 130 may extend to cover the upper surface of the frame 110. The semiconductor package 100 may further include a wiring pattern 132 disposed on the encapsulant 130 and electrically connected to the wiring structure. The wiring pattern 132 and the wiring structure (particularly, a third wiring layer 112*c*) may be connected to each other through the wiring vias 133 penetrating through the encapsulant 130.

A heat dissipation system used in the present exemplary embodiment may include the heat dissipation bonding material 182 partially embedded in the encapsulant 130 and the heat dissipation element 185 bonded to the encapsulant 130 using the heat dissipation bonding material 182.

As illustrated in FIG. 9, the heat dissipation bonding material 182 may include a portion 182*b* embedded in a region of the encapsulant 130 overlapping the semiconductor chip 120 and a portion 182*a* extending from the embedded portion 182*b* and disposed on an upper surface of the encapsulant 130. The heat dissipation element 185 may be disposed on the upper surface of the encapsulant 130 so as to cover the heat dissipation bonding material 182.

In such an arrangement, the heat dissipation bonding material 182 may be provided as a heat dissipation path between the heat dissipation element 185 and the semiconductor chip 120. In order to provide the embedded portion 182*b*, a concave portion CP or opening may be formed in the region of the encapsulant 130 overlapping the semiconductor chip 120. The concave portion CP used in the present exemplary embodiment may extend up to and contact an inactive surface of the semiconductor chip 120. That is, a bottom surface of the concave portion CP may be provided by the inactive surface of the semiconductor chip 120 (e.g., a surface of the semiconductor chip 120 opposing a surface of the semiconductor chip 120 on which the connection pads 122 are disposed).

A case in which the concave portion CP used in the present exemplary embodiment has a single structure is exemplified, but the concave portion CP may be modified to have various structures (for example, a plurality of through-holes or openings), which will be described in detail below (see, e.g., FIGS. 13 through 15).

In the present exemplary embodiment, the heat dissipation bonding material 182 may be connected to (e.g., in contact with) the inactive surface of the semiconductor chip 120 through the concave portion CP, and thus, may more effectively dissipate heat from the semiconductor chip 120.

As described above, the heat dissipation bonding material 182 used in the present exemplary embodiment may be used as a unit bonding the heat dissipation element 185 and the encapsulant 130 to each other as well as the heat dissipation path between the heat dissipation element 185 and the semiconductor chip 120.

The heat dissipation element 185 may include, for example, a heat sink, a heat spreader, a heat pipe, or a liquid cooled cool plate. The heat dissipation bonding material 182 may include a low melting point metal, for example, a low melting point metal such as tin (Sn)-aluminum (Al)-copper (Cu) alloy/mixture. However, the heat dissipation bonding material 182 is not limited thereto, and may include any material having heat dissipation characteristics and a bonding function. For example, the heat dissipation bonding material 182 may include a thermal interface material (TIM).

In the present exemplary embodiment, a support pattern 132S disposed on a partial region of the upper surface of the encapsulant 130 may be additionally provided. The support pattern 132S may be used as a unit enhancing bonding strength between the heat dissipation bonding material 182 and the encapsulant 130.

Figure 11:
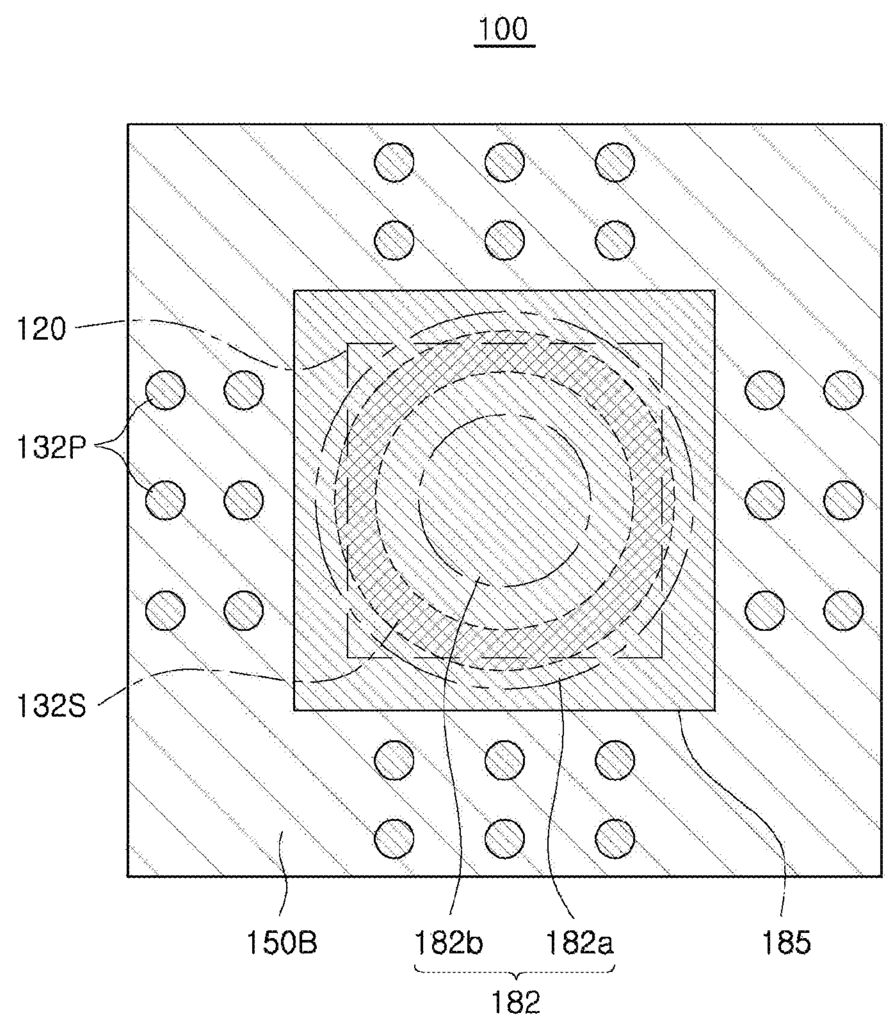
FIG. 11 is a plan view illustrating the semiconductor package of FIG. 9.

As illustrated in FIG. 11, the support pattern 132S may be formed in a ring structure along the surrounding of the concave portion CP on the upper surface of the encapsulant 130. Since the extending portion 182*a* of the heat dissipation bonding material 182 is formed to cover the support pattern 132S, the heat dissipation bonding material 182 may be firmly bonded to the support pattern 132S with a sufficient contact area. The heat dissipation bonding material 182 may be maintained in a state in which it is more stably bonded to the encapsulant 130 by the support pattern 132S.

In some exemplary embodiments, when the heat dissipation bonding material 182 and the encapsulant 130 are formed of heterogeneous materials, for example, when the heat dissipation bonding material 182 is formed of a low melting point metal and the encapsulant 130 is formed of a resin such as ABF, the support pattern 132S, which is a metal pattern, may be formed on the upper surface of the encapsulant 130 in advance, and the heat dissipation bonding material 182 may be formed to cover the support pattern 132S to ensure the stable bonding between the encapsulant 130 and the heat dissipation bonding material 182. As a result, the heat dissipation element 185 bonded to the heat dissipation bonding material 182 may be stably bonded to the surface of the encapsulant 130.

In some exemplary embodiments, the support pattern 132S may include the same metal as that of the wiring pattern 132. In detail, the support pattern 132S may be formed together with the wiring pattern 132 and the wiring vias 133 in a process of forming the wiring pattern 132 and the wiring vias 133 (for example, seed layer forming/dry film resist (DFR) patterning/plating process). For example, the support pattern 132 may include copper (Cu), aluminum (Al), silver (Ag), tin (Sn), gold (Au), nickel (Ni), lead (Pb), titanium (Ti), or combinations thereof.

Figure 12:
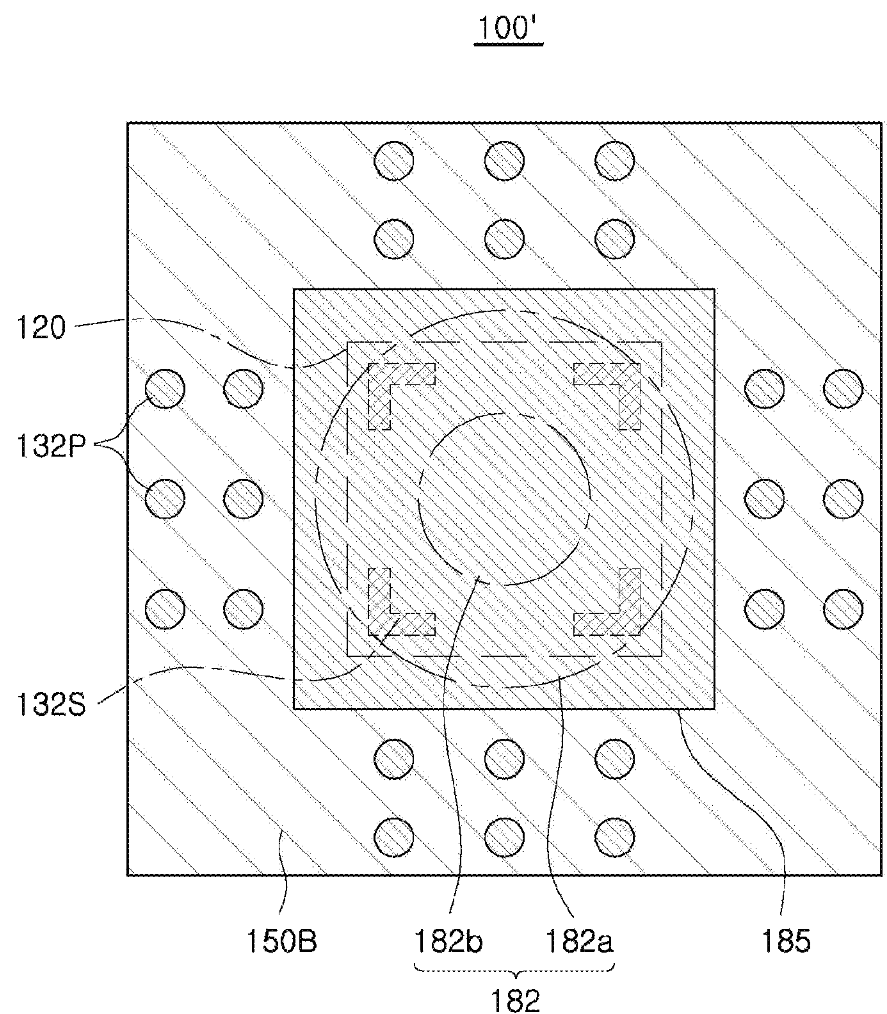
FIG. 12 is a schematic plan view illustrating a semiconductor package according to another exemplary embodiment in the present disclosure.

A case in which the support pattern 132S is a continuous pattern having the ring structure is illustrated in FIG. 11. However, the support pattern 132S is not limited thereto, and may have discontinuous patterns, as illustrated in FIG. 12. Referring to FIG. 12, the support pattern 132S may include a plurality of patterns disposed at four corners of a rectangle, respectively, and having a '┐' shape, as an example of the discontinuous patterns.

Main components of the semiconductor package 100 according to the present exemplary embodiment will hereinafter be described in more detail.

The frame 110 may improve rigidity of the semiconductor package 100 depending on certain materials, and serve to secure uniformity of a thickness of the encapsulant 130. Since the frame 110 has the wiring structure connecting the upper and lower surfaces of the frame 110 with each other, the semiconductor package 100 may be utilized as a package-on-package (POP)-type package. The semiconductor chip 120 disposed in the cavity 110H of the frame 110 may be disposed to be spaced apart from inner sidewalls of the frame 110 by a predetermined distance. Side surfaces of the semiconductor chip 120 may be surrounded by the frame 110. However, such a form is only an example and may be variously modified to have other forms, and the frame 110 may perform another function depending on such a form.

As described above, the frame 110 may include a first insulating layer 111*a* in contact with the connection structure 140, a first wiring layer 112*a* in contact with the connection structure 140 and embedded in the first insulating layer 111*a*, a second wiring layer 112*b* disposed on the other surface of the first insulating layer 111*a* opposing one surface of the first insulating layer 111*a* in which the first wiring layer 112*a* is embedded, a second insulating layer 111*b* disposed on the first insulating layer 111*a* and covering the second wiring layer 112*b*, and a third wiring layer 112*c* disposed on the second insulating layer 111*b*. The first to third wiring layers 112*a*, 112*b*, and 112*c* may be electrically connected to connection pads 122. The first to third wiring layers 112*a*, 112*b*, and 112*c* may be electrically connected to each other through first and second wiring vias 113*a* and 113*b* each penetrating through the first to second insulating layers 111*a* and 111*b*.

When the first wiring layer 112*a* is embedded in the first insulating layer 111*a* as in the present exemplary embodiment, a step generated due to a thickness of the first wiring layer 112*a* may be significantly reduced, and an insulating distance of the connection structure 140 may thus become constant. The first wiring layer 112*a* may be recessed in the first insulating layer 111*a*, such that a lower surface of the first insulating layer 111*a* and a lower surface of the first wiring layer 112*a* may have a step therebetween. In this case, a phenomenon in which a material of an encapsulant 130 bleeds to pollute the first wiring layer 112*a* may be prevented. The frame 110 may be manufactured at a sufficient thickness by a substrate process, or the like, while the connection structure 140 may be manufactured by a semiconductor process, or the like so as to have a small thickness. Therefore, a thickness of each of the first to third wiring layers 112*a*, 112*b*, and 112*c* of the frame 110 may be greater than that of each of the redistribution layers 142 of the connection structure 140.

A material of each of the first and second insulating layers 111*a* and 111*b* may be, for example, a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. In some exemplary embodiments, a photoimageable dielectric (PID) resin may also be used as the insulating material. In terms of maintenance of rigidity, the prepreg may be used as the material of each of the first and second insulating layers 111*a* and 111*b*.

The first to third wiring layers 112*a*, 112*b*, and 112*c* may serve to redistribute the connection pads 122 of the semiconductor chip 120. Each of the first to third wiring layers 112*a*, 112*b*, and 112*c* may include a conductive material such as copper (Cu), aluminum (Al), silver (Ag), tin (Sn), gold (Au), nickel (Ni), lead (Pb), titanium (Ti), or alloys thereof. The first to third wiring layers 112*a*, 112*b*, and 112*c* may perform various functions depending on designs of corresponding layers. For example, the first to third wiring layers 112*a*, 112*b*, and 112*c* may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the first to third wiring layers 112*a*, 112*b*, and 112*c* may include via pads, wire pads, ball pads, and the like.

The first and second wiring vias 113*a* and 113*b* may electrically connect the first to third wiring layers 112*a*, 112*b*, and 112*c* formed on different insulating layers 111*a* and 111*b* to each other to form a wiring structure having an interlayer connection path within the frame 110. A material of each of the first and second wiring vias 113*a* and 113*b* may be the conductive material described above. Each of the first and second wiring vias 113*a* and 113*b* may be a filled-type via filled with the conductive material, or be a conformal-type via in which the conductive material may be formed along a wall of each of via holes. Meanwhile, depending on a process, the first and second wiring vias 113*a* and 113*b* may have tapered shapes of which directions are the same as each other, that is, tapered shapes of which widths of upper portions are greater than those of lower portions, in relation to a cross section. When the first and second wiring vias 113*a* and 113*b* are formed by the same plating process, the first and second wiring vias 113*a* and 113*b* may be integrated with the second and third wiring layers 112*b* and 112*c*.

The semiconductor chip 120 may be an integrated circuit (IC) provided in an amount of several hundred to several million or more elements integrated in a single chip. In this case, the IC may be, for example, a processor chip (more specifically, an application processor (AP)) such as a central processor (for example, a CPU), a graphic processor (for example, a GPU), a field programmable gate array (FPGA), a digital signal processor, a cryptographic processor, a micro processor, a micro controller, or the like, but is not limited thereto. For example, the IC may be a memory chip such as a volatile memory (for example, a DRAM), a non-volatile memory (for example, a ROM), a flash memory, or the like, a logic chip such as an analog-to-digital converter, an application-specific IC (ASIC), or the like, or another kind of chip such as a power management IC (PMIC), or a combination of some thereof.

The semiconductor chip 120 may be formed on the basis of an active wafer. In this case, a base material of a body 121 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), copper (Cu), or the like. A passivation layer 123 opening the connection pads 122 may be formed on an active surface of the body 121, and may be an oxide layer, a nitride layer, or the like, or a double layer of an oxide layer and a nitride layer. A lower surface of the connection pad 122 may have a step with respect to a lower surface of the encapsulant 130 through the passivation layer 123. Therefore, the encapsulant 130 may fill at least portions of a space between the passivation layer 123 and the connection structure 140. In this case, a phenomenon in which the encapsulant 130 bleeds into the lower surface of the connection pad 122 may be prevented to some degree. An insulating layer (not illustrated), and the like, may also be further disposed in other appropriate positions. The semiconductor chip 120 may be a bare die, and the connection pads 122 may thus be in physical contact with connection vias 143 of the connection structure 140. However, depending on a kind of semiconductor chip 120, a separate redistribution layer (not illustrated) may further be formed on an active surface of the semiconductor chip 120, and bumps (not illustrated), or the like, may be connected to the connection pads 122.

The encapsulant 130 may protect the frame 110, the semiconductor chip 120, and the like. An encapsulation form of the encapsulant 130 is not particularly limited, but may be a form in which the encapsulant 130 surrounds at least portions of each of the frame 110 and the semiconductor chip 120. For example, the encapsulant 130 may cover the frame 110 and an inactive surface (e.g., a surface opposite to the active surface on which the connection pads 122 are formed, or a surface on which the connection pads 122 are not formed) of the semiconductor chip 120, and fill at least portions of the cavity 110H. The encapsulant 130 may fill the cavity 110H to thus serve as an adhesive and reduce buckling of the semiconductor chip 120 depending on certain materials.

A material of the encapsulant 130 may be, for example, a thermosetting resin such as an epoxy resin, a thermoplastic resin such as a polyimide resin, or a resin in which the thermosetting resin or the thermoplastic resin is mixed with an inorganic filler or is impregnated together with an inorganic filler in a core material such as a glass fiber, or the like, but is not limited thereto. In some exemplary embodiments, a material of the encapsulant 130 may be a thermosetting resin such as prepreg, ABF, FR-4, or BT or a photoimageable encapsulant (PIE) resin.

The wiring pattern 132 may be formed on the encapsulant 130 and be connected to the wiring structure (particularly, the third wiring layer 112*c*), as described above. The wiring vias 133 may penetrate through at least portions of the encapsulant 130, and may electrically connect the third wiring layer 112*c*, which is the uppermost wiring layer of the frame 110, and the wiring pattern 132 to each other. A material of each of the wiring pattern 132 and the wiring via 133 may be the conductive material described above, and be a metal such as copper (Cu) in some exemplary embodiments. In addition, each of the wiring pattern 132 and the wiring via 133 may be a plurality of conductor layers including a seed layer and a plating layer. The wiring pattern 132 may perform various functions depending on a design. For example, the wiring pattern 132 may include ground patterns, power patterns, signal patterns, and the like. The wiring via 133 may also have a tapered shape of which a width of an upper surface is greater than that of a lower surface, in relation to a cross section.

The connection structure 140 may redistribute the connection pads 122 of the semiconductor chip 120. Several tens to several hundreds of connection pads 122 of the semiconductor chip 120 having various functions may be redistributed by the connection structure 140, and may be physically and/or electrically externally connected through the electrical connection metals 170 depending on the functions.

The connection structure 140 may include insulating layers 141 in contact with the frame 110 and the semiconductor chip 120, the redistribution layers 142 disposed on the insulating layers 141, and the vias 143 penetrating through the insulating layers 141 and connecting the connection pads 122 and the redistribution layers 142 to each other. A case in which the connection structures 140 include three insulating layers 141 and three-layered redistribution layers 142 and vias 143 is exemplified in FIG. 9, but the connection structure 140 may be implemented as a single layer or two layers or as a larger number of layers than three layers in another exemplary embodiment.

A material of each of the insulating layers 141 may be a photosensitive insulating material such as a PID resin, in addition to the insulating material described above. When the insulating layer 141 has photosensitive properties, the insulating layer 141 may be formed to have a smaller thickness, and a fine pitch of the connection via 143 may be achieved more easily by a photolithography process. In some exemplary embodiments, each of the insulating layers 141 may be a photosensitive insulating layer including an insulating resin and an inorganic filler. When the insulating layers 141 are multiple layers, materials of the insulating layers 141 may be the same as each other, and may also be different from each other. Even though the insulating layers 141 are the multiple layers, a boundary between the insulating layers 141 may also not be apparent.

The redistribution layers 142 may serve to substantially redistribute the connection pads 122, and may be formed of the conductive material described above. The redistribution layers 142 may perform various functions depending on designs of corresponding layers. For example, the redistribution layers 142 may include ground patterns, power patterns, signal patterns, and the like. Here, the signal patterns may include various signals except for the ground patterns, the power patterns, and the like, such as data signals, and the like, and may include pad patterns having various shapes.

The vias 143 may electrically connect the redistribution layers 142 formed on different layers, the connection pads 122, and the like, to each other, and form an electrical path in a vertical direction (interlayer electrical path) within the semiconductor package 100. A material of each of the vias 143 may be the conductive material described above. Each of the vias 143 may be completely filled with the conductive material or the conductive material may be formed along a wall of each of the via holes. Meanwhile, each of the vias 143 of the connection structure 140 may have a tapered shape of which a direction is opposite to the tapered shapes of each of the first and second wiring vias 113*a* and 113*b* of the frame 110. That is, each of the vias 143 of the connection structure 140 may have a tapered shape of which a width of an upper surface is smaller than that of a lower surface, in relation to a cross section.

The first and second passivation layers 150A and 150B may protect the connection structure 140 and the wiring pattern 132 from external physical or chemical damage. The first and second passivation layers 150A and 150B may include the insulating material described above. In some exemplary embodiments, the first and second passivation layers 150A and 150B may include prepreg, ABF, FR-4, BT, a solder resist, or a PID. The first and second passivation layers 150A and 150B may have openings H opening partial regions of the redistribution layer 142 and the wiring pattern 132. A surface treatment layer 132P may be formed in the opened regions of the wiring pattern 132 by plating such as noble metal plating. The surface treatment layer 132P may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like, but is not limited thereto.

The underbump metals 160 may be formed in openings of the outermost insulating layer 141 or the passivation layer 150A by a metallization method using a conductive material such as a metal, but are not limited thereto. The number, an interval, a disposition form, and the like, of electrical connection metals 170 are not particularly limited, but may be sufficiently modified depending on design particulars. For example, the electrical connection metals 170 may be provided in an amount of several tens to several thousands according to the number of connection pads 122, or may be provided in an amount of several tens to several thousands or more or several tens to several thousands or less.

The electrical connection metals 170 may serve to physically and/or electrically connect the semiconductor package 100 to an external apparatus such as a mainboard of an electronic device. The electrical connection metal 170 may include a low melting point metal, for example, a solder such as tin (Sn)-aluminum (Al)-copper (Cu), or the like. The electrical connection metal 170 may be a single layer or multiple layers. For example, the multiple layers may include a copper pillar and a solder, and the single layer may include a tin-silver solder or copper.

A case in which the electrical connection metal 170 has a ball shape is exemplified, but the electrical connection metal 170 may have another structure or shape having a predetermined height, such as a land or a pin. Therefore, a predetermined mounting space may be secured on a lower surface of the insulating layer 141 by a height of the electrical connection metal 170.

At least one of the electrical connection metals 170 may be disposed in a fan-out region. The fan-out region refers to a region except for (or outside of) a region overlapping the semiconductor chip 120 (e.g., a region outside of an area of overlap with the semiconductor chip 120 along a stacking direction of the semiconductor chip 120 on the connection structure 140). The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

Although not illustrated in FIG. 9, a plurality of semiconductor chips 120 performing functions that are the same as or different from each other may be disposed in the cavity 110H. In some exemplary embodiments, a separate passive component such as an inductor, a capacitor, or the like, may be disposed in the cavity 110H. In addition, in some exemplary embodiment, a plurality of cavities 110H may be formed, and semiconductor chips 120 and/or passive components may be disposed in the cavities 110H, respectively. A metal layer may be formed on walls of the cavity 110H, optionally, in order to dissipate heat and block electromagnetic waves.

The heat dissipation system used in the present exemplary embodiment may be variously modified. For example, regions and forms of the support pattern and/or the heat dissipation bonding materials may be variously modified.

Figure 13:
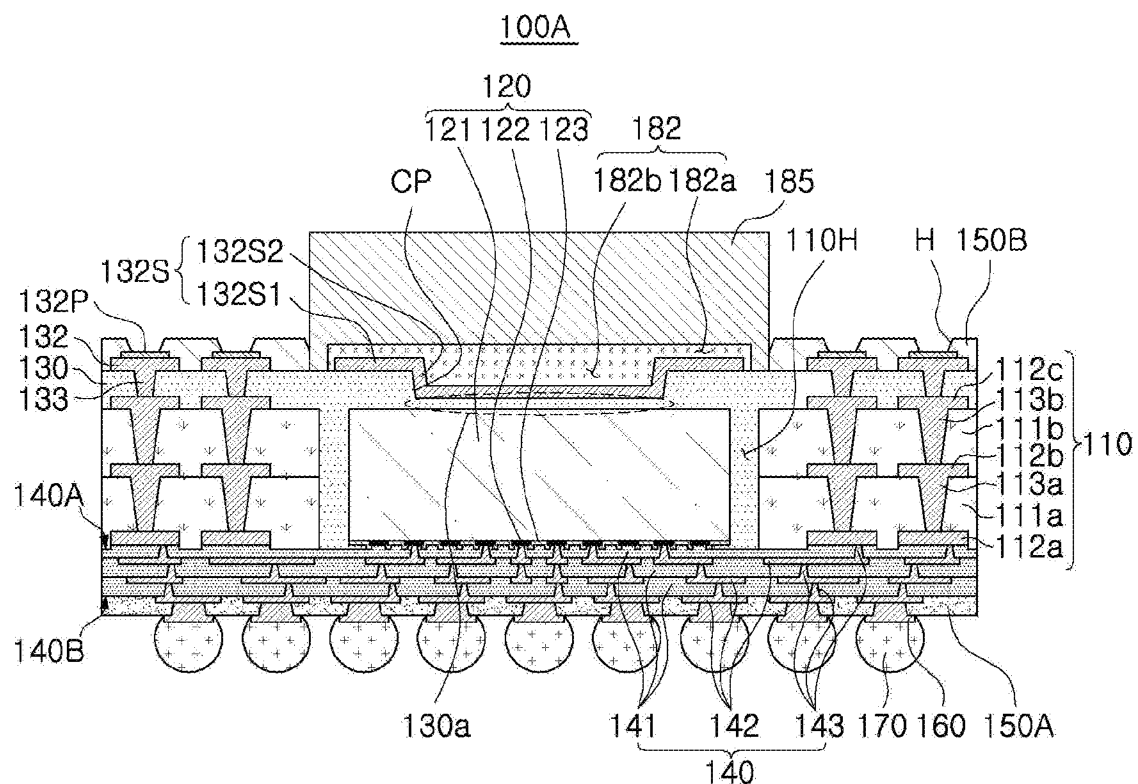
FIGS. 13 through 17 are schematic cross-sectional views illustrating semiconductor packages according to various other exemplary embodiments in the present disclosure.

FIG. 13 is a schematic cross-sectional view illustrating a semiconductor package according to another exemplary embodiment in the present disclosure.

Referring to FIG. 13, it may be understood that a semiconductor package 100A according to the present exemplary embodiment has a structure similar to that illustrated in FIGS. 9 through 11 except that a concave portion CP does not completely penetrate through an encapsulant 130 and a support pattern 132S extends up to an inner surface of the concave portion CP. Components according to the present exemplary embodiments may be understood with reference to the description for the same or similar components of the semiconductor package 100 illustrated in FIGS. 9 through 11 unless explicitly described otherwise.

The concave portion CP used in the present exemplary embodiment may be positioned in a region overlapping a semiconductor chip 120, but may not completely penetrate through the encapsulant 130 unlike the previous exemplary embodiment. A bottom surface of the concave portion CP may be provided by the encapsulant 130 and may be spaced apart from an upper surface of the semiconductor chip 120 by the encapsulant 130.

The support pattern 132S used in the present exemplary embodiment may have a portion 132S1 positioned on an upper surface of the encapsulant 130 and a portion 132S2 extending from the portion 132S1 to the inner surface of the concave portion CP. As described above, the support pattern 132S may be formed over a relatively wide area. Therefore, a heat dissipation bonding material 182 and the support pattern 132S may have a relatively wide connection area therebetween, and the heat dissipation bonding material 182 may thus be more stably coupled to the encapsulant 130 by the support pattern 132S.

In the present exemplary embodiment, even though the heat dissipation bonding material 182 is not directly connected or contacted to the semiconductor chip 120 due to the presence of encapsulant 130 (and, optionally, of the support pattern portion 132S2), an encapsulant portion (denoted by a dotted line) provided along the bottom surface of the concave portion CP may have a small thickness, and the heat dissipation bonding material 182 may thus effectively receive heat generated from the semiconductor chip 120.

In addition, the support pattern 132S may be formed of a metal (for example, Cu) having heat dissipation characteristics more excellent than (e.g., exceeding) those of the heat dissipation bonding material 182, and may be provided over a wide area to be thus used as an adhesion improving unit or an effective heat dissipation unit.

Figure 14:
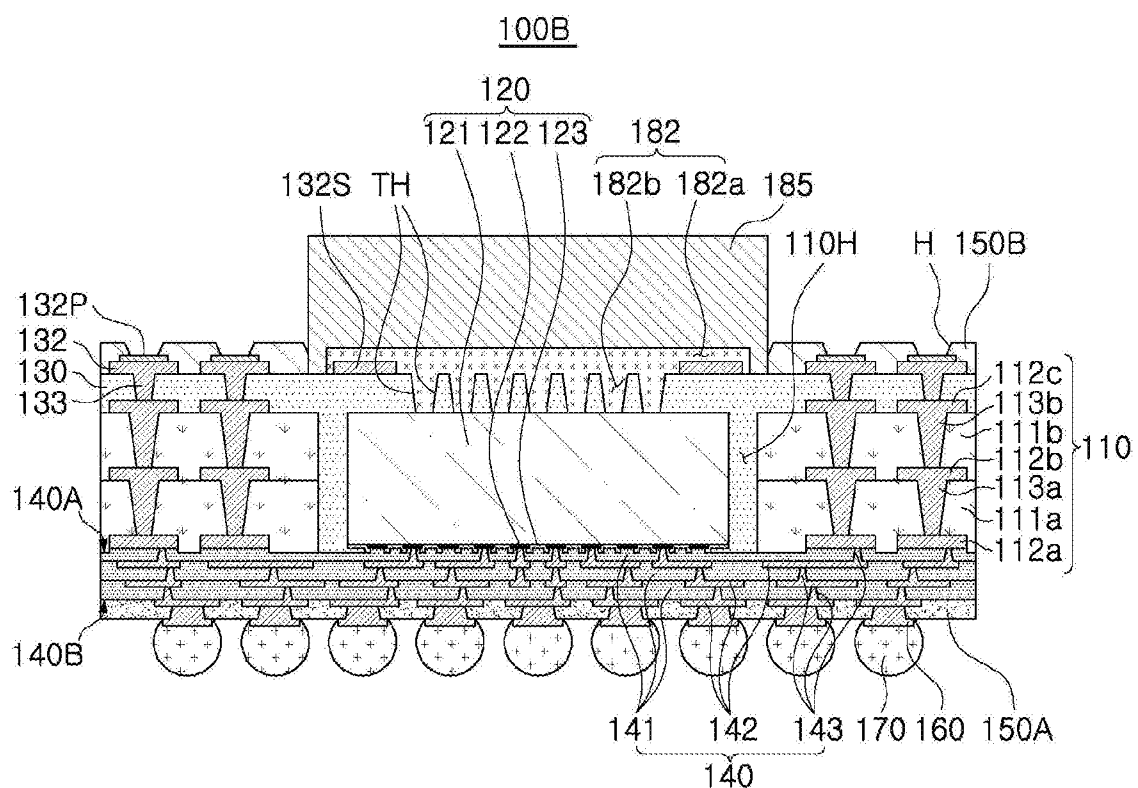

FIG. 14 is a schematic cross-sectional view illustrating a semiconductor package according to another exemplary embodiment in the present disclosure.

Referring to FIG. 14, it may be understood that a semiconductor package 100B according to the present exemplary embodiment has a structure similar to that illustrated in FIGS. 9 through 11 except that a plurality of through-holes THs are formed in an encapsulant 130. Components according to the present exemplary embodiments may be understood with reference to the description for the same or similar components of the semiconductor package 100 illustrated in FIGS. 9 through 11 unless explicitly described otherwise.

A semiconductor package 100B according to the present exemplary embodiment may have a plurality of concave portions, that is, a plurality of through-holes THs, instead of one concave portion CP, unlike the previous exemplary embodiment. The plurality of through-holes THs may be arranged in a region of the encapsulant 130 overlapping a semiconductor chip 120. It may be understood that a plurality of through-holes THs are arranged in each of row and column directions when viewed in a plane.

The plurality of through-holes THs used in the present exemplary embodiment may be formed to be connected to or to extend to an inactive surface of the semiconductor chip 120 (e.g., a surface opposite to the active surface of the semiconductor chip 120), and a heat dissipation bonding material 182 may have a portion 182*a* covering a support pattern 132S disposed on an upper surface of the encapsulant 130 and a portion 182*b* connected to or contacting the inactive surface of the semiconductor chip 120 through the plurality of through-holes THs.

In the present exemplary embodiment, the heat dissipation bonding material 182 may be stably bonded to the encapsulant 130 by the support pattern 132S, as in the exemplary embodiment illustrated in FIG. 9, and additionally, may have a wide bonding area with the encapsulant 130 by the plurality of through-holes THs and may thus be more stably bonded to the encapsulant 130. Resultantly, a heat dissipation element 185 may be more firmly bonded to the semiconductor package 100B by the heat dissipation bonding materials 182.

Figure 15:
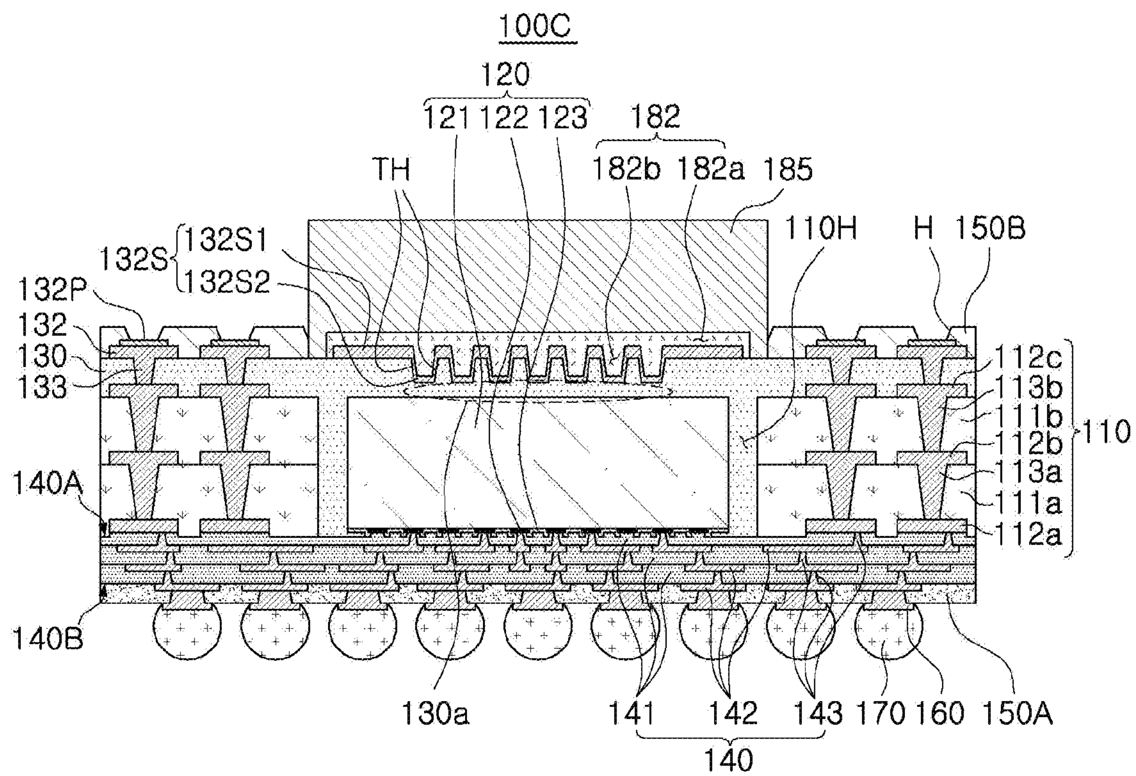

FIG. 15 is a schematic cross-sectional view illustrating a semiconductor package according to another exemplary embodiment in the present disclosure.

Referring to FIG. 15, it may be understood that a semiconductor package 100C according to the present exemplary embodiment has a structure similar to that illustrated in FIGS. 9 through 11 except that an encapsulant 130 has a plurality of through-holes THs instead of a single concave portion, but the plurality of through-holes THs do not completely penetrate through the encapsulant 130, and that a support pattern 132S extends up to inner surfaces of the respective through-holes THs. Components according to the present exemplary embodiments may be understood with reference to the description for the same or similar components of the semiconductor package 100 illustrated in FIGS. 9 through 11 unless explicitly described otherwise.

The plurality of through-holes THs used in the present exemplary embodiment may be disposed in a region overlapping a semiconductor chip 120, similar to the through-holes illustrated in FIG. 14, but do not completely penetrate through the encapsulant 130 unlike the through-holes illustrated in FIG. 14. The support pattern 132S may have a portion 132S1 positioned on an upper surface of the encapsulant 130 and a portion 132S2 extending from the portion 132S1 to the inner surfaces of the respective through-holes THs.

As described above, a heat dissipation bonding material 182 and the support pattern 132S may have a relatively wide connection area therebetween, and the heat dissipation bonding material 182 may thus be more stably coupled to the encapsulant 130 by the support pattern 132S.

In addition, as in the exemplary embodiment illustrated in FIG. 13, even though the heat dissipation bonding material 182 is not directly connected to or contacting the semiconductor chip 120 due to presence of the encapsulant 130, an encapsulant portion (denoted by a dotted line) provided to a bottom surface of the through-holes THs may have a small thickness, and the support pattern 132S is formed of a metal (for example, Cu) having heat dissipation characteristics more excellent than those of the heat dissipation bonding material 182, and the heat dissipation bonding material 182 may thus effectively dissipate heat generated from the semiconductor chip 120.

Figure 16:
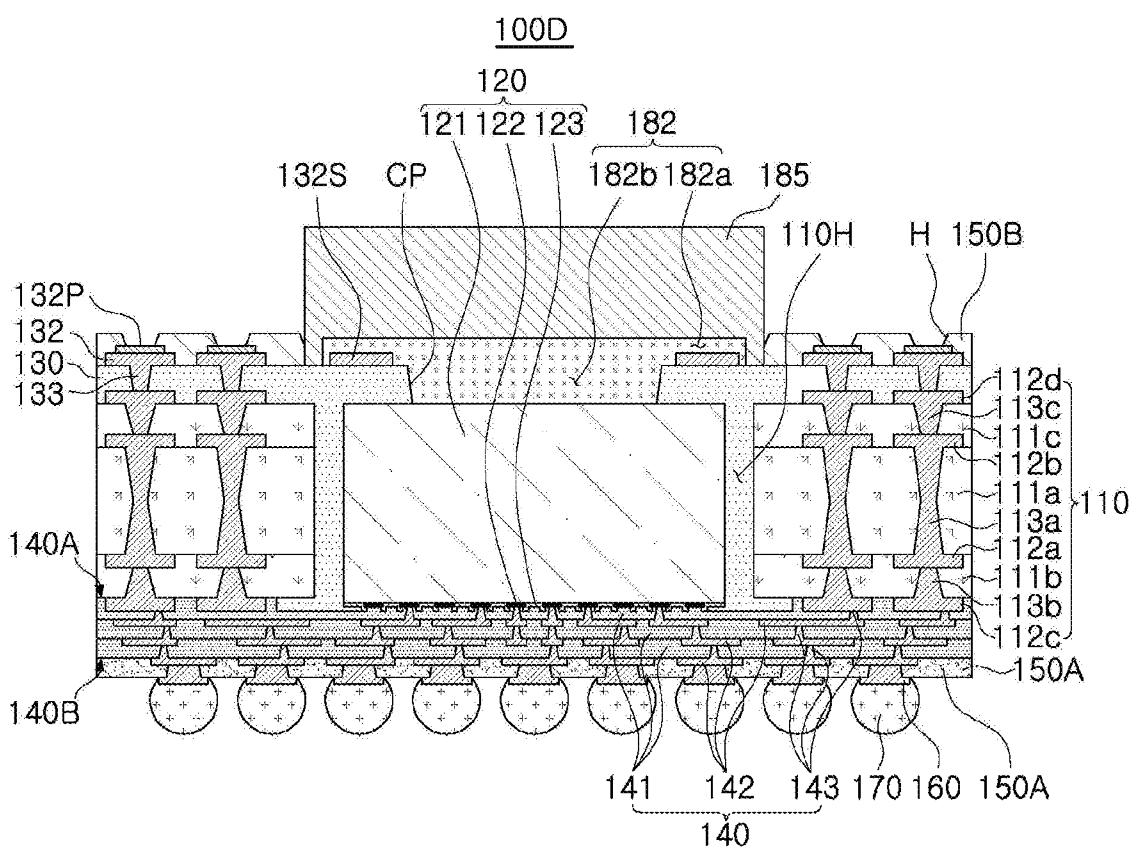
Figure 17:
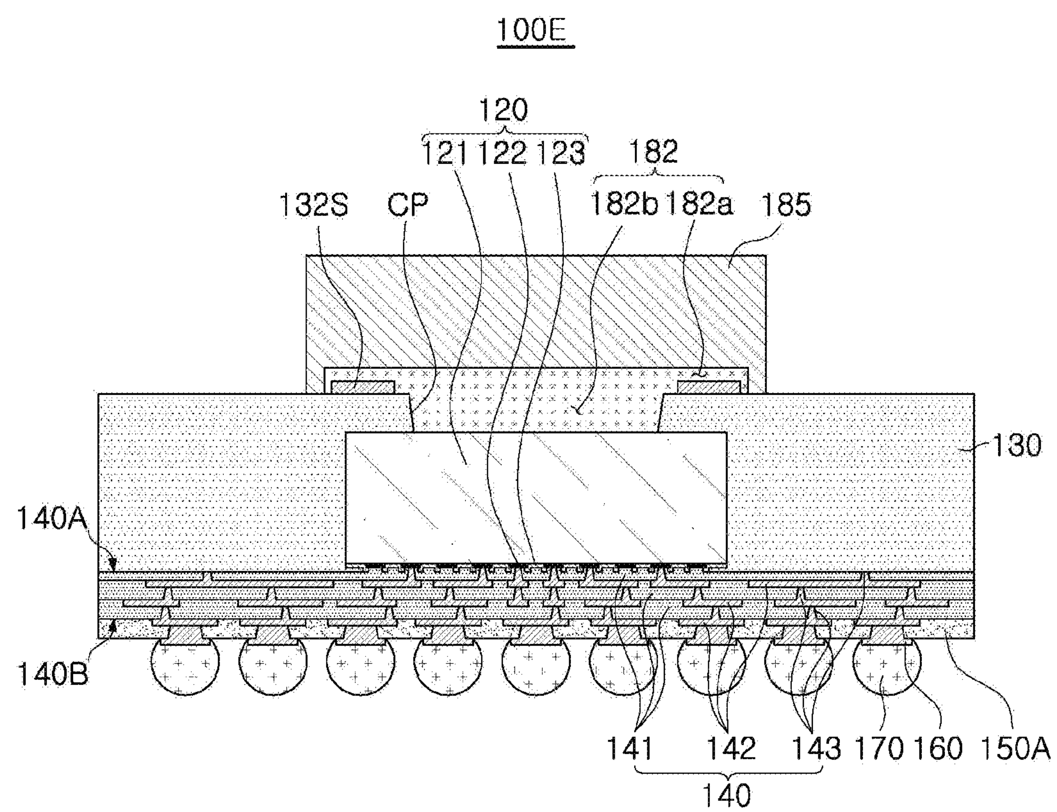

FIGS. 16 and 17 are schematic cross-sectional views illustrating semiconductor packages according to various exemplary embodiments in the present disclosure.

Referring to FIG. 16, it may be understood that a semiconductor package 100D according to the present exemplary embodiment has a structure similar to that illustrated in FIGS. 9 through 11 except for a form of a wiring structure of a frame 110. Components according to the present exemplary embodiments may be understood with reference to the description for the same or similar components of the semiconductor package 100 illustrated in FIGS. 9 through 11 unless explicitly described otherwise.

A frame 110 used in the present exemplary embodiment may have a structure different from that of the frame 110 described above, and a wiring structure of the frame 110 may thus be modified. In detail, the frame 110 may include a first insulating layer 111*a*, a first wiring layer 112*a* disposed on one surface of the first insulating layer 111*a*, a second wiring layer 112*b* disposed on another surface of the first insulating layer 111*a*, a second insulating layer 111*b* disposed on the one surface of the first insulating layer 111*a* and covering at least portions of the first wiring layer 112*a*, a third wiring layer 112*c* disposed on the other surface of the second insulating layer 111*b* opposing one surface of the second insulating layer 111*b* in which the first wiring layer 112*a* is embedded, a third insulating layer 111*c* disposed on the other surface of the first insulating layer 111*a* and covering at least portions of the second wiring layer 112*b*, and a fourth wiring layer 112*d* disposed on the other surface of the third insulating layer 111*c* opposing one surface of the third insulating layer 111*c* in which the second wiring layer 112*b* is embedded. First wiring vias 113*a* penetrate through the first insulating layer 111*a* and electrically connect the first and second wiring layers 112*a* and 112*b* to each other, second wiring vias 113*b* penetrate through the second insulating layer 111*b* and electrically connect the first and third wiring layers 112*a* and 112*c* to each other, and third wiring vias 113*c* penetrate through the third insulating layer 111*c* and electrically connect the second and fourth wiring layers 112*b* and 112*d* to each other. Since the frame 110 used in the present exemplary embodiment has a larger number of wiring layers 112*a*, 112*b*, 112*c*, and 112*d*, redistribution layers 142 of a connection structure 140 may further be simplified.

The first insulating layer 111*a* may have a thickness greater than those of the second insulating layer 111*b* and the third insulating layer 111*c*. The first insulating layer 111*a* may be basically relatively thick in order to maintain rigidity, and the second insulating layer 111*b* and the third insulating layer 111*c* may be introduced in order to form a larger number of wiring layers 112*c* and 112*d*. The first insulating layer 111*a* may include an insulating material different from those of the second insulating layer 111*b* and the third insulating layer 111*c*. For example, the first insulating layer 111*a* may be, for example, prepreg including a core material such as a glass fiber, an inorganic filler, and an insulating resin, and the second insulating layer 111*b* and the third insulating layer 111*c* may be an ABF or a PID including an inorganic filler and an insulating resin. However, the materials of the first insulating layer 111*a* and the second and third insulating layers 111*b* and 111*c* are not limited thereto. Similarly, the first wiring vias 113*a* penetrating through the first insulating layer 111*a* may have a diameter greater than those of the second and third wiring vias 113*b* and 113*c* each penetrating through the second and third insulating layers 111*b* and 111*c*. In addition, the first wiring via 113*a* may have an hourglass shape or a cylindrical shape, while the second and third wiring vias 113*b* and 113*c* may have tapered shapes of which directions are opposite to each other. Thicknesses of the first to fourth wiring layers 112*a*, 112*b*, 112*c*, and 112*d* may be greater than those of the redistribution layers 142 of the connection structure 140.

Referring to FIG. 17, it may be understood that a semiconductor package 100E according to the present exemplary embodiment has a structure similar to that illustrated in FIGS. 9 through 11 except that it does not include components (a wiring structure, a wiring pattern, and the like) associated with a frame. Components according to the present exemplary embodiments may be understood with reference to the description for the same or similar components of the semiconductor package 100 illustrated in FIGS. 9 through 11 unless explicitly described otherwise.

The semiconductor package 100E according to the present exemplary embodiment does not use the frame, and an encapsulant 130 may be disposed on a first surface 140A of a connection structure 140 to encapsulate a semiconductor chip 120. In some exemplary embodiments, the semiconductor package 100E may be configured to include electrical paths (for example, metal posts, or the like) connected to redistribution layers of the connection structure 140 and penetrating through the encapsulant in a vertical direction.

A heat dissipation system used in the present exemplary embodiment may include a heat dissipation bonding material 182 partially embedded in the encapsulant 130 and a heat dissipation element 185 bonded to the encapsulant 130 using the heat dissipation bonding material 182, similar to the exemplary embodiment illustrated in FIG. 9. In addition, a support pattern 132S disposed on a partial region of an upper surface of the encapsulant 130 may further be included.

The heat dissipation bonding material 182 may include a portion 182*b* embedded in a region of the encapsulant 130 overlapping the semiconductor chip 120 and a portion 182*a* extending from the embedded portion 182 and disposed on the upper surface of the encapsulant 130. The heat dissipation element 185 may be disposed on the upper surface of the encapsulant 130 so as to cover the heat dissipation bonding material 182.

In this arrangement, the heat dissipation bonding material 182 used in the present exemplary embodiment may be used as a unit bonding the heat dissipation element 185 and the encapsulant 130 to each other as well as to provide a heat dissipation path between the heat dissipation element 185 and the semiconductor chip 120. In addition, the support pattern 132S may be used as a unit enhancing bonding strength between the heat dissipation bonding material 182 and the encapsulant 130.

As set forth above, according to an exemplary embodiment in the present disclosure, a semiconductor package may be provided in which heat dissipation characteristics are excellent and a heat dissipation element may be firmly maintained to improve reliability.

While exemplary embodiments have been shown and described above, it will be apparent to those skilled in the art that modifications and variations could be made without departing from the scope of the present invention as defined by the appended claims.

What is claimed is:

1. A semiconductor package comprising:

a connection structure having first and second surfaces opposing each other and including a redistribution layer;

a semiconductor chip disposed on the first surface of the connection structure and having connection pads connected to the redistribution layer;

an encapsulant disposed on the first surface of the connection structure and covering the semiconductor chip;

a support pattern disposed on a portion of an upper surface of the encapsulant;

a heat dissipation bonding material having a portion embedded in the encapsulant in a region overlapping the semiconductor chip and extending to the upper surface of the encapsulant so as to cover the support pattern; and a heat dissipation element bonded to the upper surface of the encapsulant by the heat dissipation bonding material, wherein the support pattern is interposed between the upper surface of the encapsulant and the heat dissipation bonding material.

2. The semiconductor package of claim 1, wherein the embedded portion of the heat dissipation bonding material penetrates through the encapsulant and contacts the semiconductor chip.

3. The semiconductor package of claim 1, wherein the embedded portion of the heat dissipation bonding material is spaced apart from the semiconductor chip by the encapsulant.

4. The semiconductor package of claim 3, wherein the support pattern extends between the embedded portion of the heat dissipation bonding material and the encapsulant.

5. The semiconductor package of claim 1, wherein the embedded portion of the heat dissipation bonding material includes portions filled in a plurality of through-holes formed in the encapsulant.

6. The semiconductor package of claim 5, wherein the embedded portion of the heat dissipation bonding material contacts the semiconductor chip through the plurality of through-holes.

7. The semiconductor package of claim 1, wherein the heat dissipation element is disposed on the upper surface of the encapsulant so as to cover the heat dissipation bonding material.

8. The semiconductor package of claim 1, wherein the heat dissipation bonding material includes a low melting point metal which is different from a metal of the support pattern.

9. The semiconductor package of claim 1, further comprising:

a frame disposed on the first surface of the connection structure and having a cavity in which the semiconductor chip is disposed.

10. The semiconductor package of claim 9, wherein the encapsulant covers an upper surface of the frame and the semiconductor package further comprises a wiring pattern disposed on the encapsulant, and wherein the frame further includes a wiring structure electrically connecting the wiring pattern and the redistribution layer.

11. The semiconductor package of claim 10, wherein the support pattern includes a same metal as the wiring pattern.

12. A semiconductor package comprising:

a semiconductor chip having an active surface having connection pads disposed thereon and an inactive surface opposing the active surface;

a connection structure disposed on the active surface of the semiconductor chip and including a redistribution layer electrically connected to the connection pads;

an encapsulant covering the inactive surface of the semiconductor chip and having a concave portion in a region overlapping the semiconductor chip in an upper surface of the encapsulant;

a support pattern disposed on at least a region of the upper surface of the encapsulant positioned adjacent to the concave portion;

a heat dissipation bonding material disposed in the concave portion and extending to the upper surface of the encapsulant so as to cover the support pattern; and a heat dissipation element disposed on the upper surface of the encapsulant so as to cover the heat dissipation bonding material and be bonded to the encapsulant by the heat dissipation bonding material, wherein the support pattern is interposed between the upper surface of the encapsulant and the heat dissipation bonding material.

13. The semiconductor package of claim 12, wherein a bottom surface of the concave portion is provided by the encapsulant.

14. The semiconductor package of claim 13, wherein the support pattern extends to an inner surface of the concave portion.

15. The semiconductor package of claim 12, wherein the concave portion of the encapsulant extends to the inactive surface of the semiconductor chip, and the heat dissipation bonding material contacts the inactive surface of the semiconductor chip.

16. The semiconductor package of claim 12, wherein the support pattern is disposed in a ring structure surrounding the concave portion on the upper surface of the encapsulant.

17. A semiconductor package comprising:

a semiconductor chip having an active surface with connection pads thereon and a second surface opposite to the active surface;

an encapsulant contacting the semiconductor chip and having an opening overlapping with the semiconductor chip in a surface of the encapsulant facing away from the second surface of the semiconductor chip;

a support pattern disposed, adjacent to the opening, on the surface of the encapsulant facing away from the semiconductor chip;

a bonding material disposed in the opening of the encapsulant and covering at least a portion of the support pattern adjacent to the opening; and a heat dissipation element disposed on the bonding material to overlap the opening, wherein the support pattern is interposed between the surface of the encapsulant and the bonding material.

18. The semiconductor package of claim 17, wherein the bonding material contacts the second surface of the semiconductor chip through the opening of the encapsulant.

19. The semiconductor package of claim 17, wherein the encapsulant includes a plurality of openings overlapping with the semiconductor chip; and the bonding material is disposed in each of the plurality of openings of the encapsulant.

20. The semiconductor package of claim 17, wherein the support pattern extends into the opening in the surface of the encapsulant, and the opening corresponds to a portion of the encapsulant having a reduced thickness in a location overlapping the semiconductor chip.

* * * * *